US008673087B2

(12) United States Patent
Feustel et al.

(10) Patent No.: US 8,673,087 B2
(45) Date of Patent: Mar. 18, 2014

(54) REDUCING COPPER DEFECTS DURING A WET CHEMICAL CLEANING OF EXPOSED COPPER SURFACES IN A METALLIZATION LAYER OF A SEMICONDUCTOR DEVICE

(75) Inventors: Frank Feustel, Dresden (DE); Tobias Letz, Dresden (DE); Christin Bartsch, Lauterbach (DE); Andreas Ott, Dresden (DE)

(73) Assignee: Advanced Micro Devices, Inc., Sunnyvale, CA (US)

( * ) Notice: Subject to any disclaimer, the term of this patent is extended or adjusted under 35 U.S.C. 154(b) by 988 days.

(21) Appl. No.: 12/124,445

(22) Filed: May 21, 2008

(65) Prior Publication Data
US 2009/0139543 A1 Jun. 4, 2009

(30) Foreign Application Priority Data
Nov. 30, 2007 (DE) .......................... 10 2007 057 685

(51) Int. Cl.
*B08B 5/04* (2006.01)
(52) U.S. Cl.
USPC .................... 134/21; 134/31; 134/34; 134/37
(58) Field of Classification Search
None
See application file for complete search history.

(56) References Cited

U.S. PATENT DOCUMENTS

| 3,357,927 | A | * | 12/1967 | Marsh et al. | ............... | 252/389.2 |
| 3,382,302 | A | * | 5/1968 | Marzocchi | ................ | 264/45.3 |
| 3,391,450 | A | * | 7/1968 | Bauer | .................... | 29/527.4 |
| 4,266,601 | A | * | 5/1981 | Jenkins | ......................... | 165/94 |
| 5,800,626 | A | | 9/1998 | Cohen et al. | ................... | 134/1.3 |
| 6,158,447 | A | | 12/2000 | Kamikawa et al. | ......... | 134/56 R |
| 6,167,891 | B1 | | 1/2001 | Kudelka et al. | ............... | 134/1.3 |
| 6,943,115 | B2 | | 9/2005 | Horiuchi et al. | .............. | 438/692 |
| 2002/0115284 | A1 | | 8/2002 | Wu et al. | | |
| 2004/0183874 | A1 | * | 9/2004 | Toyoda et al. | .................. | 347/86 |
| 2005/0008605 | A1 | * | 1/2005 | L'Alloret | ................... | 424/70.16 |

OTHER PUBLICATIONS

Translation of Official Communication from German Patent Office for German Patent Application No. 10 2007 057 685.6 dated Feb. 8, 2010.

* cited by examiner

*Primary Examiner* — Eric Golightly (57) ABSTRACT

A method for treating a semiconductor device includes dissolving an inert gas species in a wet chemical cleaning solution and treating a material layer of a semiconductor device with the wet chemical cleaning solution in ambient atmosphere. The inert gas species is oversaturated in the wet chemical cleaning solution in the ambient atmosphere.

16 Claims, 4 Drawing Sheets

REDUCING COPPER DEFECTS DURING A WET CHEMICAL CLEANING OF EXPOSED COPPER SURFACES IN A METALLIZATION LAYER OF A SEMICONDUCTOR DEVICE

BACKGROUND OF THE INVENTION

1. Field of the Invention

The present disclosure generally relates to the field of fabrication of integrated circuits, and, more particularly, to manufacturing an interconnect structure requiring wet chemical cleaning processes of surfaces including exposed copper areas.

2. Description of the Related Art

In a complex integrated circuit, a very large number of circuit elements, such as transistors, capacitors, resistors and the like, are formed in or on an appropriate substrate, usually in a substantially planar configuration. Due to the large number of circuit elements and the required complex layout of the integrated circuits, generally the electrical connection of the individual circuit elements may not be established within the same level on which the circuit elements are manufactured, but requires one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnect structures.

Due to the continuous shrinkage of the feature sizes of circuit elements in modern integrated circuits, the number of circuit elements for a given chip area, that is, the packing density, also increases, thereby requiring an even larger increase in the number of electrical interconnections to provide the desired circuit functionality. Therefore, the number of stacked metallization layers typically increases as the number of circuit elements per chip area becomes larger. Since the fabrication of a plurality of metallization layers entails extremely challenging issues to be solved, such as ensuring the mechanical, thermal and electrical reliability of many stacked metallization layers that are required, for example, for sophisticated microprocessors, semiconductor manufacturers are increasingly using a metal that allows for high current densities and reduced dimensions of the interconnections. For example, copper is a metal generally considered to be a viable candidate due to its superior characteristics in view of higher resistance against electromigration and significantly lower electrical resistivity when compared with other metals, such as aluminum, that have been used over the last decades. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures due to its lack of forming volatile etch byproducts. In manufacturing metallization layers including copper, the so-called damascene technique is therefore preferably used wherein a dielectric layer is first applied and then patterned to receive trenches and vias, which are subsequently filled with copper. A further major drawback of copper is its property to readily diffuse in low-k dielectric materials, silicon and silicon dioxide, which is a well-established and approved dielectric material in fabricating integrated circuits.

It is therefore necessary to employ a so-called barrier material in combination with a copper-based metallization to substantially avoid any out-diffusion of copper into the surrounding dielectric material, as copper may readily migrate to sensitive semiconductor areas, thereby significantly changing the characteristics thereof. On the other hand, the barrier material may suppress the diffusion of reactive components into the metal region. The barrier material provided between the copper and the dielectric material should exhibit, however, in addition to the required barrier characteristics, good adhesion to the dielectric material as well as to the copper and should also have as low an electrical resistance as possible so as to not unduly compromise the electrical properties of the interconnect structure. Moreover, the barrier layer may also act as a "template" for the subsequent deposition of the copper material in view of generating a desired crystalline configuration, since a certain degree of information of the texture of the barrier layer may be transferred into the copper material to obtain a desired grain size and configuration. It turns out, however, that a single material may not readily meet the requirements imposed on a desired barrier material. Hence, a mixture of materials may frequently be used to provide the desired barrier characteristics. For instance, a bi-layer comprised of tantalum and tantalum nitride is often used as a barrier material in combination with a copper damascene metallization layer. Tantalum, which effectively blocks copper atoms from diffusing into an adjacent material, even when provided in extremely thin layers, however, exhibits only a poor adhesion to a plurality of dielectric materials, such as silicon dioxide based dielectrics, so that a copper interconnection including a tantalum barrier layer may suffer from reduced mechanical stability, especially during the chemical mechanical polishing of the metallization layer, which may be employed for removing excess copper and planarizing the surface for the provision of a further metallization layer. The reduced mechanical stability during the CMP process may, however, entail severe reliability concerns in view of reduced thermal and electrical conductivity of the inter-connections. On the other hand, tantalum nitride exhibits excellent adhesion to silicon dioxide based dielectrics, but has very poor adhesion to copper. Consequently, in advanced integrated circuits having a copper-based metallization, typically a barrier bi-layer of tantalum nitride/tantalum is used. The demand for a low resistance of the interconnect structure in combination with the continuous reduction of the dimensions of the circuit elements and associated therewith of the metal lines and vias requires the thickness of the barrier layer to be reduced, while nevertheless providing the required barrier effect. It has been recognized that tantalum nitride provides excellent barrier characteristics even if applied with a thickness of only a few nanometers and even less. Thus, sophisticated deposition techniques have been developed for forming thin tantalum nitride layers with high conformality even in high aspect ratio openings, such as the vias of advanced metallization structures, wherein the desired surface texture with respect to the further processing may also be obtained.

Since the dimensions of the trenches and vias have currently reached a width or a diameter of approximately 0.1 μm and even less with an aspect ratio of the vias of about 5 or more, the deposition of a barrier layer reliably on all surfaces of the vias and trenches and subsequent filling thereof with copper substantially without voids is a very challenging issue in the fabrication of modern integrated circuits. Currently, the formation of a copper-based metallization layer is accomplished by patterning an appropriate dielectric layer to form trenches and/or vias therein and depositing the barrier layer, for example comprised of tantalum (Ta) and/or tantalum nitride (TaN), by advanced physical vapor deposition (PVD) techniques, such as sputter deposition. Due to the many constraints for advanced devices, as explained above, the surface of the patterned structure may have to be conditioned prior to the deposition of the barrier material and also prior to the deposition of the copper material. For this purpose, usually wet chemical cleaning processes may be performed, for instance, on the basis of hydrofluoric acid. Thereafter, the copper is filled in the vias and trenches, wherein electroplating has proven to be a viable process technique, since it is capable of filling the vias and trenches with a high deposition rate, compared to CVD and PVD rates, in a so-called bottom-up regime, in which the openings are filled starting at the bottom in a substantially void-free manner.

It turns out, however, that in higher metallization levels a degradation of the vias may be observed, which is believed to be caused by tiny copper voids at the interface of a via to an underlying copper line. These voids in the copper interface may be created during the patterning of the overlying dielectric material of the next metallization layer, since, in this sequence, copper of the lower copper line is exposed within the via opening formed in the overlying dielectric material. Thus, at a certain state, after etching respective trenches for the metal lines of the next metallization layer, copper in the associated vias may be exposed, thereby resulting in copper voids and thus interconnect degradation.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a technique and a system that enable the formation of metal-filled openings in a material layer of a semiconductor device, wherein degradation mechanisms may be reduced by enhancing respective cleaning processes that may typically be required for preparing the surface conditions for the subsequent deposition of metal-containing materials, such as barrier materials, copper-based materials and the like. As previously explained, the reliability of interconnect structures may depend on the quality of interfaces between different metal-containing materials, such as an interface between copper and a barrier material and the like, wherein, in particular, any exposed copper surfaces during the cleaning process may, despite the advantages generally obtained by the cleaning process, suffer from unwanted material removal which may result in tiny voids, thereby reducing the electrical performance of the respective interface while also contributing to a reduced reliability. Consequently, the techniques and systems disclosed herein enable an efficient wet chemical cleaning process with a reduced defect rate at sensitive surface areas, such as exposed copper-containing surface areas, in that the presence of oxygen during the wet chemical cleaning process may be significantly reduced while not unduly contributing to the overall process and system complexity.

One illustrative method disclosed herein comprises providing a patterned dielectric layer of a metallization layer of a semiconductor device wherein the patterned dielectric layer comprises an exposed copper surface. The method further comprises enriching a wet chemical cleaning solution with an inert gas species and cleaning the dielectric layer with the wet chemical cleaning solution in ambient atmosphere. Finally, the method comprises forming a metal region in the cleaned dielectric layer so as to connect to the copper surface.

A further illustrative method disclosed herein comprises dissolving an inert gas species in a wet chemical cleaning solution in a pressurized gas ambient that is substantially comprised of an inert gas species. Furthermore, the method comprises treating a material layer of a semiconductor device with the wet chemical cleaning solution in ambient atmosphere.

One illustrative apparatus disclosed herein comprises a storage container configured to contain a wet chemical cleaning solution and to accommodate a pressurized gas ambient. The apparatus further comprises a process chamber configured to receive a semiconductor substrate in an intermediate manufacturing stage. Additionally, the apparatus comprises a supply system connected to the storage container and to the process chamber, wherein the supply system is configured to supply the wet chemical cleaning solution to the process chamber. Finally, the apparatus comprises an inert gas source connected to the storage container and configured to provide a pressurized inert gas to the storage container to establish a pressurized inert gas ambient in the storage container.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the principles disclosed herein provide process techniques and respective apparatuses which enable or support wet chemical cleaning processes to be performed with a reduced defect rate by significantly suppressing the presence of oxygen, while not unduly affecting the overall process of applying the wet chemical cleaning solutions to respective sensitive material layers of semiconductor devices. Without intending to restrict the present application to the following explanation, it is believed that the presence of oxygen during the application of wet chemical cleaning solutions, such as hydrofluoric acid (HF), may have a significant impact on sensitive device areas, in particular exposed copper areas, as may be the case in sophisticated patterning strategies for forming metallization layers of advanced semi-conductor devices. In other cases, advanced deposition strategies have been proposed with respect to the electrochemical deposition of copper-based materials in which copper may be directly deposited on a respective barrier material, such as a tantalum-based barrier layer or a ruthenium-based barrier material, wherein efficient wet chemical cleaning processes may also have to be performed to prepare and activate the corresponding barrier material prior to the electrochemical deposition of the copper material. Also, in this case, reducing the amount of oxygen that is present during the application of the wet chemical cleaning solution may be advantageous with respect to the further electrochemical treatment of the barrier material and the finally obtained quality of the respective metal region. According to the principles disclosed herein, the presence of oxygen may be significantly reduced without requiring undue modification or without any modifications in a respective process chamber, thereby not unduly contributing to additional complexity of wet chemical treatments. For reducing the presence of oxygen, the wet chemical cleaning solution may be prepared so as to have incorporated therein a moderately high amount of an inert gas species prior to actually applying the wet chemical cleaning solution, thereby reducing the probability of dissolving oxygen gas during the application of the wet chemical cleaning solution and during the actual treatment. The incorporation of the inert gas species may be accomplished, in some illustrative embodiments, on the basis of a pressurized inert gas ambient in which the wet chemical cleaning solution may be "saturated" with the inert gas species at increased pressure levels, which may then result in a substantially "oversaturated" state when applied to the material layer under consideration under the conditions of ambient atmosphere, that is, in the presence of ambient air at ambient pressure that is lower compared to the pressure prevailing in the previously established pressurized inert gas ambient, thereby efficiently reducing the rate of incorporation of gas components included in the ambient atmosphere, such as oxygen.

In conventional strategies, wet chemical cleaning solutions are typically maintained in a storage tank with ambient atmosphere, thereby resulting in incorporation into the wet chemical cleaning solution. Furthermore, during the application in the respective process chamber, which is typically performed under ambient pressure, oxygen may also be incorporated into the solution, thereby causing contact of oxygen with sensitive surface areas such as exposed copper portions. Consequently, due to the respective chemical reaction, for instance, in the case of exposed copper, a significant oxidation may occur which, in combination with the wet chemical cleaning solution, may result in an increased removal rate of the oxidized portion, thereby also contributing to a local "copper depletion," which may finally result in respective voids. In other cases, the oxygen contained in the wet chemical cleaning solution, such hydrofluoric acid and the like, may result in oxidation of sensitive areas, such as barrier materials, which may not necessarily result in enhanced material removal but may have a significant influence on the further processing, for instance, with respect to the electrochemical deposition of a copper-based material directly on the barrier material as previously explained. Thus, by efficiently enriching the wet chemical cleaning solution, for instance, by generating a substantially "oversaturated" state during the actual application and treatment, the probability of incorporating additional gas components and thus oxygen may be significantly reduced, thereby allowing the treatment under ambient conditions while nevertheless reducing the overall defect rate of the process.

It should be appreciated that the principles disclosed herein are highly advantageous in the context of material layers of semiconductor devices when exposed copper surface areas may come into contact with a wet chemical cleaning solution since, in this case, as previously explained, an undue local copper oxidation and thus unwanted material removal may be reduced, thereby enhancing reliability and performance of respective interfaces. In other cases, reducing the amount of oxygen that may be present during the wet chemical cleaning of sensitive surface areas may be highly advantageous without contributing to a significant material removal but may be advantageous by "simply" reducing an oxidation or any other chemical reaction caused by the presence of oxygen as it may, for instance, be the case for barrier materials acting as "seed layers" for a direct electrochemical deposition of copper. Hence, the present disclosure should not considered as being restricted to the wet chemical cleaning of material layers of semiconductor devices in which exposed copper surface areas are present, unless such restrictions are specifically set forth in the appended claims.

Figure 1A:
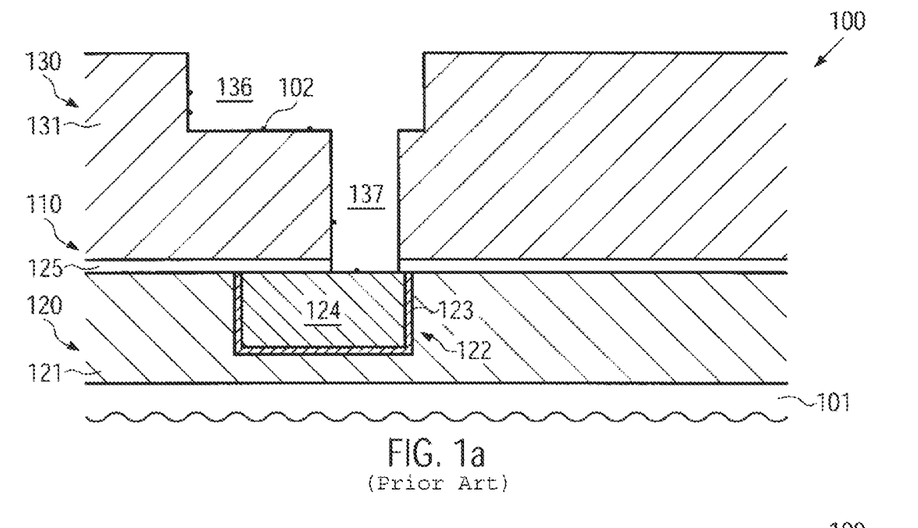
FIGS. 1a-1c schematically illustrate cross-sectional views of a semiconductor device during various manufacturing stages in treating a material layer, for instance, a patterned dielectric layer, with a wet chemical cleaning solution, including an inert species, to reduce the probability of incorporating oxygen, even when applied in ambient atmosphere, according to illustrative embodiments.

FIG. 1a schematically illustrates a cross-sectional view of a semiconductor device 100 which may represent any microstructure device requiring the formation of metal lines and vias therein. In this respect, the term "semiconductor device" is to be understood as a generic term for indicating any device fabricated in accordance with micro patterning techniques. The semiconductor device 100 may comprise a substrate 101 which may include semiconductor elements, such as transistors, capacitors and the like as are typically provided in highly advanced integrated circuits, such as microprocessors, memory circuits and the like. For this purpose, the substrate 101 may include any appropriate material for forming therein or thereon respective circuit elements. In other cases, the substrate 101 may represent any appropriate carrier material for forming thereabove a metallization structure 110 in accordance with device requirements wherein not necessarily circuit elements may be incorporated in the substrate 101. The metallization structure 110 may comprise, in some illustrative embodiments, a first metallization layer 120 comprising a dielectric material 121, which, in sophisticated applications, may comprise a dielectric material of reduced permittivity, wherein a dielectric constant may have a value of 3.0 and less. In other cases, more conventional dielectric materials, such as silicon dioxide, silicon nitride and the like, may be used for forming the dielectric material 121. The metallization layer 120 may further comprise a metal feature, such as a metal line 122, which may have lateral dimensions, i.e., in FIG. 1a, the horizontal extension, of approximately 100 nm or less at lower metallization levels of sophisticated semiconductor devices. In other cases, metal regions of significant difference in size, with dimensions of 100 nm to several micrometers, may concurrently be present in the metallization layer 120. If, for instance, the metallization layer 120 represents the first metallization level or the contact level for providing direct electrical contact to respective circuit elements, such as transistors and the like, the lateral dimensions of the metal region 122 may have to be adapted to the dimensions of contact areas of the circuit elements, thereby requiring highly scaled metal regions to be formed on the basis of advanced techniques. As previously explained, transistor elements having a gate length of 50 nm or less, or with 30 nm and less, may pose strict constraints on the metallization techniques and the thus the appropriate preparation of material surfaces.

The metal region 122 may comprise a barrier layer 123 to confine the metal 124, such as copper, from the surrounding dielectric material of the layer 121. Furthermore, the metallization layer 120 may comprise a cap layer 125 which may be comprised of any appropriate material such as silicon nitride, silicon carbide, nitrogen-containing silicon carbide and the like. The cap layer 125 may be used as an etch stop layer in the further processing of the semiconductor device 100 while, in other cases, the cap layer 125 may also provide confinement of the metal 124 if required. Furthermore, the semiconductor device 100 may comprise a further material layer 130 which may represent a further metallization level in a manufacturing stage, in which metals are still to be provided. The material layer 130 may thus also comprise an appropriate dielectric material 131, for instance, comprising a low-k dielectric material as previously explained. Furthermore, as shown, the material layer 130 may be patterned so as to have a trench 136 and an opening 137, which may be referred to as a via opening, which connects to the metal region 122 of the lower lying metallization layer 120. It should be appreciated that the openings 136 and 137 may represent the manufacturing stage according to various embodiments, in which appropriate damascene strategy may be applied. It should be appreciated, however, that the form and size of the openings 136, 137 may depend on the overall process strategy. For instance, the depth of the trench 136 may vary in accordance with the specific metallization level under consideration and may even extend down to the etch stop layer 125. Hence, in this case, the "vertical" extension of the via opening 137 may thus also vary correspondingly. In the embodiment shown, the opening 137 may be formed so as to expose a portion of the metal region 122, which may comprise copper, as previously explained.

The semiconductor device 100 as shown in FIG. 1a may be formed on the basis of the following processes. The metallization layer 120 may be formed above the substrate 101, in which may have been formed respective circuit elements on the basis of well-established techniques by depositing the dielectric material 121 and patterning the same to receive a corresponding opening, which may subsequently be filled with the metal 124, or the barrier material 123, which may be comprised of a plurality of different material compositions, may be applied, as is also described above. Next, the cap layer 125 may be formed, for instance, on the basis of plasma enhanced deposition techniques, followed by the deposition of the dielectric material 131. Next, the openings 136 and 137 may be formed, for instance, by first forming the opening 137 and subsequently defining the trench 136, or by first forming the trench 136 and thereafter forming the opening 137, on the basis of established lithography and etch techniques. In other cases, the opening 137 may be formed first, without forming the trench 136, wherein, in this case, the thickness of the dielectric layer 131 may be appropriately adapted so as to take into consideration a subsequent deposition of a further dielectric material whose thickness is suitably selected for accommodating the trench 136. In any case, during the respective patterning regime, metal may be exposed, for instance, at the bottom of the via opening 137 as shown, or at the top of a respective via, when this via is formed prior to patterning the trench opening 136. During the corresponding pattern processes, respective etch chemistries are used which may result in etch byproducts or other contamination that may be present on exposed surface portions, which are generally indicated as contaminants 102.

As previously explained, for sophisticated applications, the surface of a dielectric material prior to the deposition of sensitive barrier materials having a reduced thickness, and/or the exposed surfaces of a respective barrier material deposited prior to a direct electro-chemical deposition of copper material may have to be conditioned so as to at least reduce the contaminants 102. For this purpose, wet chemical cleaning treatments represent viable process techniques for removing and conditioning the exposed surface areas.

Figure 1B:
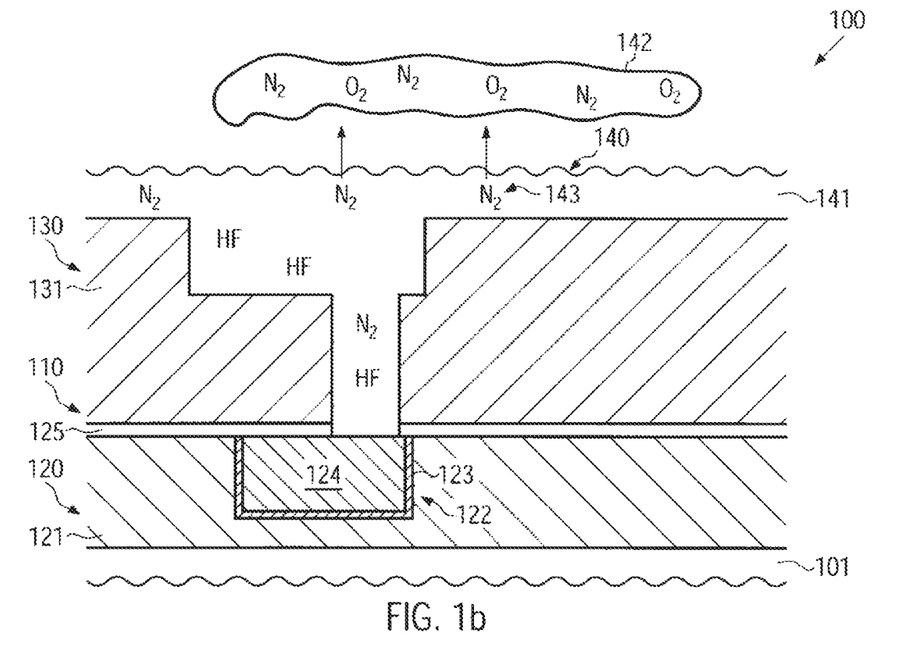

FIG. 1b schematically illustrates the semiconductor device 100 in a further advanced manufacturing stage, in which the device 100 is subjected to a wet chemical cleaning process 140, during which a wet chemical cleaning solution 141 is applied in one illustrative embodiment in an ambient atmosphere 142, that is, in ambient air under atmospheric pressure, thereby significantly facilitating the application of the wet chemical cleaning solution 141. For instance, diluted hydrofluoric acid (DHF) may be used in a plurality of sophisticated applications, for instance, when cleaning the surface of patterned dielectric material of metallization layers, preparing and conditioning the surface of barrier materials, such as tantalum-based or ruthenium-based barrier materials, and the like. It should be appreciated, however, that other wet chemical cleaning solutions may be used, depending on the process strategy, wherein the presence of oxygen may be suppressed on the basis of the principles disclosed herein.

The wet chemical cleaning solution 141 may be provided in a stage in which a significant amount of an inert gas species 143, for instance, in one illustrative embodiment in the form of nitrogen gas, is dissolved in the solution, thereby reducing the probability of incorporating a further gas species from the ambient atmosphere 142. In other cases, any appropriate inert gas species 143 may be incorporated so as to retain a highly saturated state of the solution 141. In one illustrative embodiment, the solution 141 may have incorporated the inert gas species 143 in an "oversaturated" state, that is, with respect to the pressure level of the ambient atmosphere 142, the concentration of the inert gas species 143 dissolved in the solution 141 may be higher than the corresponding equilibrium state in the ambient atmosphere 142, thereby resulting in "out-diffusion" of the inert gas species 143. Thus, the capability of "accepting" gas molecules from the ambient atmosphere 142 may be significantly reduced in this oversaturated state, while additionally the out-gassing inert species 143 may provide an increased nitrogen concentration in the vicinity of the surface of the solution 141, thereby further reducing the probability of incorporating oxygen molecules. Consequently, during the treatment 140, the presence of oxygen at exposed surface areas and in particular at an exposed surface area of the metal region 122 may be significantly reduced, while nevertheless allowing operation under standard atmospheric conditions.

Figure 1C:
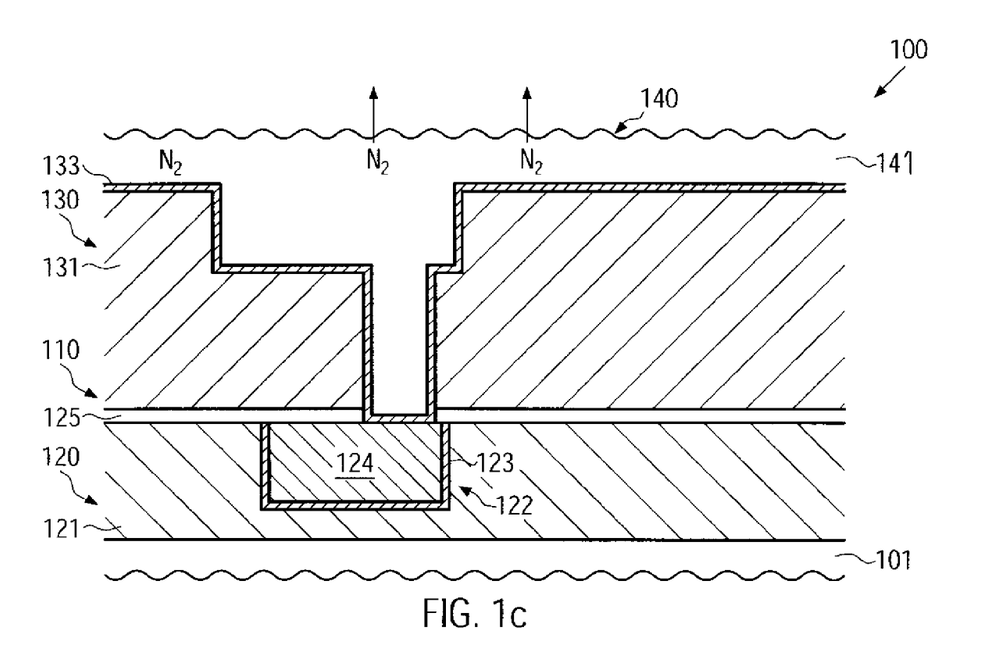

FIG. 1c schematically illustrates the semiconductor device 100 according to further illustrative embodiments, in which, additionally or alternatively, the treatment 140 may be applied in a manufacturing stage in which a barrier layer 133 is formed on exposed surface portions of the dielectric material 131. For instance, tantalum-based materials or ruthenium-based materials may be considered as appropriate candidates for direct electrochemical deposition of copper, and also in this case the treatment 140 may provide enhanced surface conditions, wherein a suppression of the presence of oxygen in the wet chemical solution 141 may be advantageous. Thus, also in this case, the treatment 140 may be performed under standard ambient atmosphere conditions, while the high amount of dissolved inert gas species 143 may reduce the presence of oxygen and thus the probability of chemically reacting with the exposed surface materials.

Figure 2A:
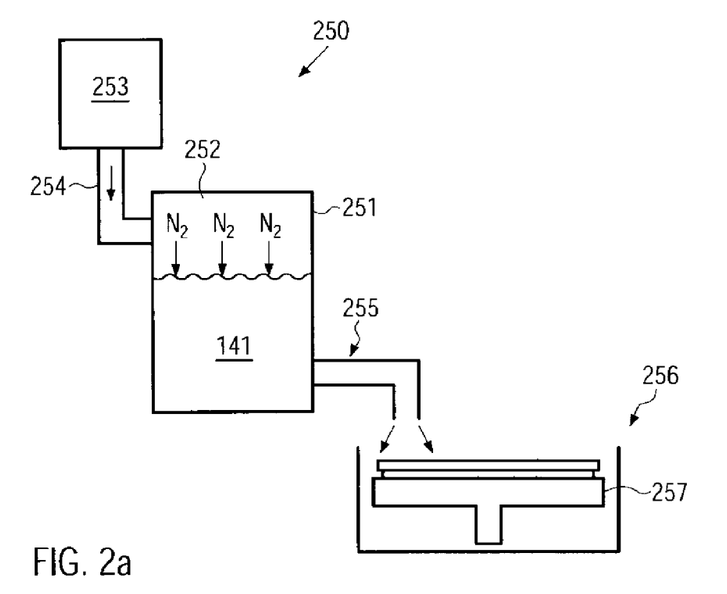
FIGS. 2a-2c schematically illustrate various process tools or apparatuses used for applying a wet chemical cleaning solution in a highly saturated state with respect to an inert gas species in order to avoid incorporation of oxygen during application of the wet chemical cleaning solution, according to further illustrative embodiments.

FIG. 2a schematically illustrates an apparatus or a process tool 250, which is appropriately configured to provide a wet chemical cleaning solution, such as the solution 141, in an appropriate state for reducing the presence of oxygen. The apparatus 250 may comprise a storage tank or container 251 that is appropriately configured to accommodate a required type of wet chemical cleaning solution, such as diluted or concentrated hydrofluoric acid, or any other desired chemistry. Thus, in an operational state, the container 251 may comprise a wet chemical cleaning solution, such as the solution 141, and may further be configured to accommodate a pressurized inert gas ambient 252, in which any appropriate inert gas species, such as nitrogen or noble gases and the like, may be applied in a high pressurized state, that is, with a pressure that is higher than the pressure prevailing during the actual application of the wet chemical cleaning solution 141. For example, the pressure of the gas ambient 252 may be established on the basis of nitrogen and/or other inert species with a pressure of approximately 1.5 to 10 bars or even higher. The apparatus 250 may further comprise an inert gas source 253 connected to the storage container 251 via an appropriate supply line 254, which may comprise any appropriate means for controlling a fluid flow from the pressurized gas source 253 to the storage container 251. For example, respective valves, pumps and the like may be used. For instance, the pressurized gas source 253 may contain a pressurized gas tank, which may enable supply of one or more inert gas species via a respective valve to the storage tank 251.

Moreover, the apparatus 250 may comprise a supply system 255 connected to the storage container 251 and to a process chamber 256, which is appropriately configured to treat a semiconductor substrate at any intermediate manufacturing stage, such as the substrate 101 as previously described with reference to FIGS. 1a-1c. For this purpose, the process chamber 256 may include any appropriate substrate holder 257 for receiving the respective substrate and holding the same in position during the wet chemical cleaning treatment. Furthermore, the supply system 255 is appropriately configured to provide a required amount of the wet chemical cleaning solution 141 to the substrate surface in the process chamber 256, so that the solution may be applied to, for instance it may be sprayed on, the respective surface. As previously explained, the process chamber 256 may be operated in ambient air, thereby avoiding complex and complicated mechanisms for loading and unloading the substrate to and from the process chamber 256 or for appropriately establishing a respective process environment after positioning the substrate, such as the substrate 101, on the substrate holder 257, which may in addition result in increased complexity of the tool and may also contribute to a reduced overall throughput. Furthermore, the supply system 255 may also be operated without requiring specific measures with respect to maintaining special environmental conditions, since the wet chemical cleaning solution may be prepared in an appropriate manner so as to reduce the probability of incorporating additional oxygen during transport of the solution 141 to the process chamber 256.

During operation of the apparatus 250, a pressurized gas species may be supplied to the storage container 251, which may contain a desired amount of a wet chemical cleaning solution, such as hydrofluoric acid. The inert gas species delivered by the supply line 254 may thus create the pressurized inert gas ambient 252, which may result in increased incorporation of the inert gas species, wherein, in some illustrative embodiments, a substantially saturated, that is an equilibrium state with respect to the dissolving gas in the liquid 141, may be established. This may be achieved by ensuring that a sufficiently high amount of liquid is permanently present in the container 251, while the amount of liquid to be supplied to the process chamber 256 may be a moderately low percentage of the overall volume in the container 251. Under these conditions, a substantially saturated state may be achieved in some illustrative embodiments. At any rate, in the pressurized inert gas ambient 252, a significant enrichment of the solution 141 may be accomplished. Upon demand, the enriched or saturated wet chemical cleaning solution 141 is supplied to the process chamber 256 via the supply system 255, wherein the liquid may come into contact with ambient air and ambient pressure, wherein, due to the previously enriched or saturated state, the wet chemical cleaning solution may be in a substantially "oversaturated" state in the ambient air pressure, thereby significantly reducing the probability of incorporating additional gas molecules. Hence, efficient operation under atmospheric conditions may be achieved, while nevertheless significantly enhancing the overall efficiency of the respective wet chemical cleaning treatment.

Figure 2B:
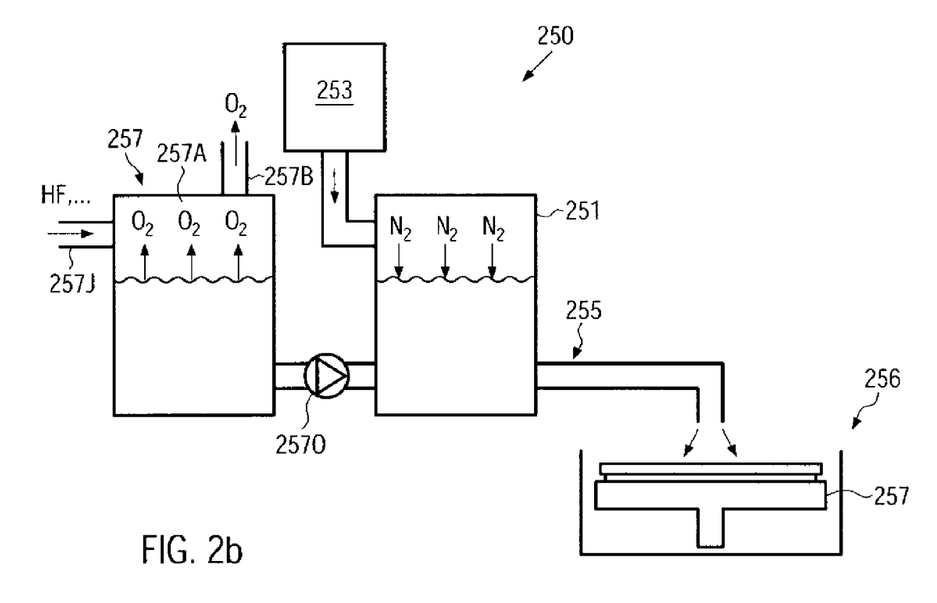

FIG. 2b schematically illustrates the apparatus 250 according to further illustrative embodiments, in which, in addition to the components described with reference to FIG. 2a, a degas module 257 may be provided that is connected to the storage container 251. The degas module 257 may comprise an input 257J for receiving wet chemical cleaning solution and may also comprise an output 257O that is configured to supply a wet chemical cleaning solution to the storage container 251, for instance, via an appropriate supply line, which may include respective pumps, valves and the like. Furthermore, the degas module 257 may be configured to establish a low pressure ambient 257A, for instance, by an exhaust line 257B, which may be coupled to a suction pump and the like. Thus, by establishing the low pressure ambient 257A, outgassing of any gas components dissolved in the wet chemical cleaning solution delivered to the module 257 via the input 257J may be "driven" out of the liquid with an increased rate and may be discharged via the suction line 257B. Thus, an equilibrium state with respect to the low pressure ambient 257A may be achieved or at least a significantly reduced amount of gas may remain dissolved in the liquid, which may then be supplied to the storage container 251 via the output 257O. Thus, due to the reduced amount of gas components dissolved in the liquid supplied to the container 251, the subsequent saturation of the liquid in the high pressure ambient 252 may result in an increased ratio of inert gas species to other gas components. Thus, the presence of other gas components, such as oxygen, may further be reduced, thereby even further enhancing the efficiency of the wet chemical treatment.

In some illustrative embodiments, the degas module 257 may further comprise appropriate heating elements, for instance for heating container walls, or internal resistive heating elements and the like to establish an increased temperature, for instance, in the range of approximately 50-90° C., thereby even further enhancing the out-gassing of dissolved gas components in the low pressure ambient 257A.

Figure 2C:
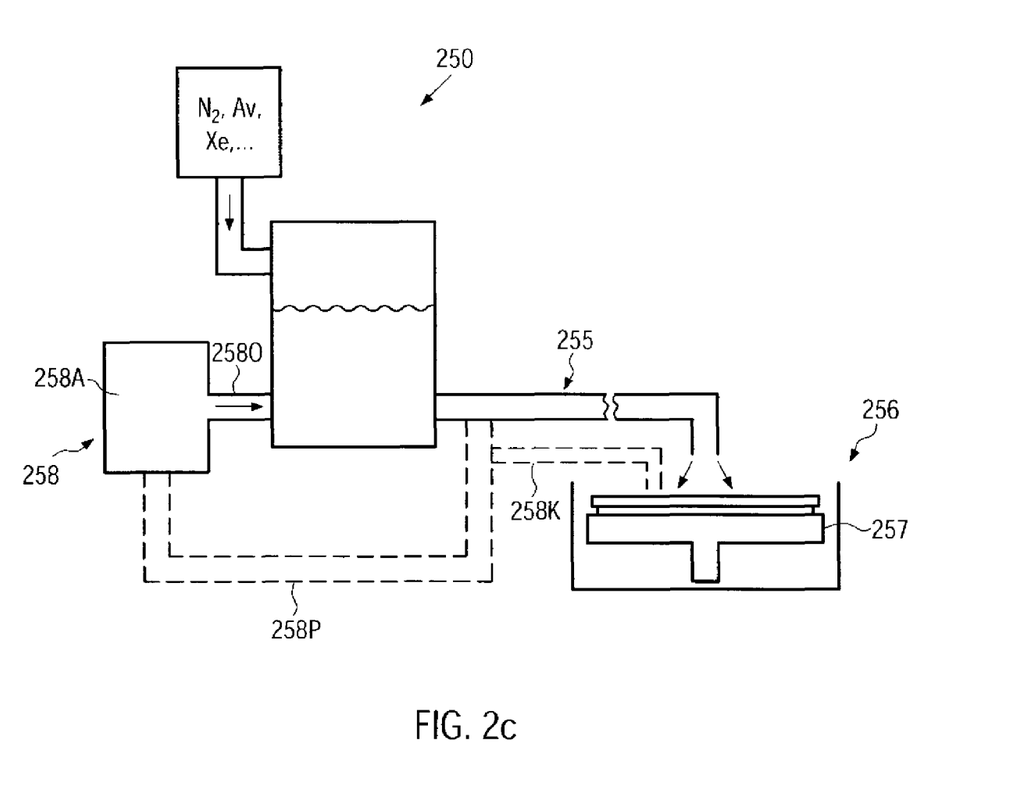

FIG. 2c schematically illustrates the apparatus 250 according to further illustrative embodiments in which an additional module 258 may be provided, for instance, in addition to or alternatively to the degas module 257, wherein the module 258 may be configured to introduce additives into the wet chemical cleaning solution, for instance in the form of oxygen gettering substances 258A, which may be supplied to the storage container 251 via a respective supply line 258O and/or to the supply system 255 via a respective supply line 258P. In other illustrative embodiments, the module 258 may be directly connected to the process chamber via a respective supply line 258K. For example, the module 258 may be configured to supply substances such as 3,4,5 hydroxybenzoic acid, hydrazine, hydroxylamine and the like so as to obtain a concentration of approximately 0.5-1 volume percent resulting in an efficient reduction of free oxygen atoms or molecules in the wet chemical cleaning solution, thereby also reducing the probability for a chemical reaction with exposed surface portions. In other cases, the substances 258A may include, in addition or alternatively to oxygen gettering materials, a reducing agent, for instance in the form of dimethylaminobenzoat (DMAB), thereby also reducing the effect of any oxygen that may still be present in the wet chemical cleaning solution or that may be incorporated during application in the process chamber 256.

As a result, the subject matter disclosed herein provides process techniques, in combination with respective process tools, in which a wet chemical cleaning solution may be provided with a significantly reduced amount of oxygen dissolved therein, while not requiring modification in a respective process chamber. For this purpose, the wet chemical cleaning solution may be conditioned by enriching the liquid with an inert gas species, such as nitrogen, or any other appropriate gases, such as noble gases, which may be accomplished by establishing a pressurized inert gas ambient, to create a saturated or at least enriched state of inert gas dissolved in the liquid. Upon applying the chemical cleaning solution under ambient air conditions, the solution may exhibit a saturated or even an oversaturated state, due to reduced pressure compared to the previously established pressurized inert gas ambient, thereby reducing the probability of incorporating oxygen from the ambient atmosphere, without requiring sophisticated environmental conditions during the application and treatment of respective semiconductor devices. Hence, material layers, such as dielectric materials of metallization layers of advanced semiconductor devices, may be treated with increased efficiency, since the presence of oxygen may be reduced, which may enhance surface characteristics of sensitive device areas, such as exposed copper surface portions or barrier materials, of patterned trenches and vias.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a semiconductor device, comprising:
providing a patterned dielectric layer of a metallization layer of said semiconductor device, said patterned dielectric layer comprising an exposed copper surface;
dissolving an inert gas species in a wet chemical cleaning solution in a container at a first pressure;
cleaning said dielectric layer with said wet chemical cleaning solution in ambient atmosphere exhibiting a second pressure less than the first pressure, wherein said inert gas species out-diffuses from said wet chemical cleaning solution during said cleaning; and
forming a metal region in said cleaned dielectric layer, said metal region connecting to said copper surface.

2. The method of claim 1, wherein dissolving said inert species said wet chemical cleaning solution comprises exposing said wet chemical cleaning solution to said inert gas species in a pressurized gas ambient substantially comprised of said inert gas species.

3. The method of claim 1, wherein said gas species comprises nitrogen.

4. The method of claim 1, wherein said wet chemical cleaning solution comprises hydrofluoric acid (HF).

5. The method of claim 1, further comprising incorporating an oxygen gettering material into said wet chemical cleaning solution at least when using said wet chemical cleaning solution for cleaning said patterned dielectric layer.

6. A method for treating a semiconductor device, comprising:
dissolving an inert gas species in a wet chemical cleaning solution in a container at a first pressure; and
treating a material layer of said semiconductor device with said wet chemical cleaning solution in ambient atmosphere exhibiting a second pressure less than the first pressure, wherein said inert gas species out-diffuses from said wet chemical cleaning solution during said treating of said material layer.

7. The method of claim 6, wherein dissolving said inert gas species in said wet chemical cleaning solution comprise providing said inert gas spices in a pressurized gas ambient in the container for said wet chemical cleaning solution.

8. The method of claim 6, wherein said inert gas spices is nitrogen.

9. The method of claim 6, wherein said wet chemical cleaning solution comprises hydrofluoric acid.

10. The method of claim 6, further comprising providing said material layer by patterning a dielectric layer of a metallization layer of said semiconductor device.

11. The method of claim 10, wherein patterning said dielectric layer comprises at least temporarily exposing a copper surface prior to treating said material layer.

12. The method of claim 11, wherein said treating said material layer comprises exposing said at least temporarily exposed copper surface to said wet chemical cleaning solution.

13. The method of claim 11, further comprising forming a barrier material on said patterned dielectric layer and treating said barrier material with said wet chemical cleaning solution.

14. The method of claim 6, further comprising degassing said wet chemical cleaning solution prior to dissolving said inert gas species.

15. The method of claim 7, further comprising degassing said wet chemical cleaning solution prior to dissolving said inert gas species in an environment including in an inert gas ambient at a pressure lower than a pressure of said pressurized gas ambient.

16. The method of claim 14, further comprising incorporating an oxygen gettering material into said wet chemical cleaning solution at least when using said wet chemical cleaning solution for treating said material layer.

* * * * *